(12) United States Patent
Vankayala (10) Patent No.: US 12,394,755 B2
(45) Date of Patent: Aug. 19, 2025

(54) INTER-DIE SIGNAL LOAD REDUCTION TECHNIQUE IN MULTI-DIE PACKAGE

(71) Applicant: Micron Technology, Inc., Boise, ID (US)

(72) Inventor: Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 466 days.

(21) Appl. No.: 17/887,362

(22) Filed: Aug. 12, 2022

(65) Prior Publication Data

US 2023/0395565 A1 Dec. 7, 2023

Related U.S. Application Data

(60) Provisional application No. 63/348,371, filed on Jun. 2, 2022.

(51) Int. Cl.
*H01L 25/065* (2023.01)
*H01L 23/00* (2006.01)
*H01L 25/00* (2006.01)

(52) U.S. Cl.
CPC .......... *H01L 25/0657* (2013.01); *H01L 24/49* (2013.01); *H01L 25/50* (2013.01); *H01L 2224/49107* (2013.01); *H01L 2224/4911* (2013.01); *H01L 2224/49174* (2013.01); *H01L 2224/49421* (2013.01); *H01L 2924/1434* (2013.01)

(58) Field of Classification Search
CPC .................................................. H01L 25/0657
See application file for complete search history.

(56) References Cited

U.S. PATENT DOCUMENTS

2018/0068981 A1\* 3/2018 Kim ..................... H01L 25/0657

\* cited by examiner

*Primary Examiner* — Yu-Hsi D Sun
(74) *Attorney, Agent, or Firm* — Greenberg Traurig (57) ABSTRACT

Systems, methods, and devices related to techniques for reducing inter-die signal loads within a multi-die package are disclosed. The multi-die package includes a first memory die handling interfacing with a host for the package and at least one second memory die coupled to and configured to communication with the first memory die via an inter-die connection. A technique involves adding an additional wirebond pad to each die in the multi-die package. When the inter-die connections are made, the wirebond pad associated with the first memory die transmitter is connected to the wirebond pad associated with the receiver of a second memory die that is not connected to the transmitter of the second memory die. By not connecting to the transmitter of the second memory die, the first memory die transmits inter-die signals to the second memory die such that a lower signal load is achieved within the multi-die package.

21 Claims, 7 Drawing Sheets

INTER-DIE SIGNAL LOAD REDUCTION TECHNIQUE IN MULTI-DIE PACKAGE

RELATED APPLICATIONS

The present application claims priority to Prov. U.S. Pat. App. Ser. No. 63/348,371 filed Jun. 2, 2022, the entire disclosures of which application are hereby incorporated herein by reference.

FIELD OF THE TECHNOLOGY

At least some embodiments disclosed herein relate to memory devices in general, and more particularly, but not limited to inter-die signal load reduction techniques for use in multi-die packages of memory devices.

BACKGROUND

Typically, a computing system includes one or more processors and one or more memory devices, such as memory chips or integrated circuits. The memory devices may be utilized to store data that may be accessed, modified, deleted, and/or replaced. The memory devices may be, for example, non-volatile memory devices that retain data irrespective of whether the memory devices are powered on or off. Such non-volatile memories may include, but are not limited to, read-only memories, solid state drives, and NAND flash memories. Additionally, the memory devices may be volatile memory devices, such as, but not limited to, dynamic and/or static random-access memories, which retain stored data while powered on, but are susceptible to data loss when powered off.

Based on receipt of an input, the one or more processors of the computing system may request that a memory device of the computing system retrieve stored data associated with or corresponding to the input. In certain scenarios, the data retrieved from the memory device may include instructions, which may be executed by the one or more processors to perform various operations and/or may include data that may be utilized as inputs for the various operations. In instances where the one or more processors perform operations based on instructions from the memory device, data resulting from the performance of the operations may be subsequently stored into the memory device for future retrieval.

As the amount of data generated by computing systems has steadily increased, so has the need to increase memory density within computing systems. To increase memory density within a computing system, one technique that has been utilized has been to stack multiple memory die on top of one another inside a single package of a memory device to achieve multiple higher memory sizes. Notably, this stacking provides multiple higher memory size without substantially increasing the board space footprint. One memory stacking technique involves utilizing a primary die to handle all the interfacing to an outside system (i.e., command, address, clock input, data I/O, and the like) and also to communicate with secondary die via internal signals transmitted within the package of the memory device.

Currently, inter-die signals transmitted within the package of the memory device contact the transmitter, receiver, and electrostatic discharge (ESD) load on each die within the stack, and, as a result, as the stack height increases, the load in the inter-die signals increases. While increasing the transmitter size is an option to counteract the foregoing, doing so results in larger footprint usage on the board space, higher current consumption, larger propagation delays, and greater die-to-die variation.

BRIEF DESCRIPTION OF THE DRAWINGS

The embodiments are illustrated by way of example and not limitation in the figures of the accompanying drawings in which like references indicate similar elements.

DETAILED DESCRIPTION

The present disclosure describes various embodiments of systems, memory devices, and methods that may be utilized to facilitate inter-die signal load reduction within a multi-die package of a memory device. As indicated herein, as the amount of data to be processed and stored by computing systems continues to increase over time, the ability to effectively increase memory density without consuming significant amounts of board space becomes increasingly necessary and important. A technique that has been utilized to increase memory density in current computing systems has been to stack multiple memory die on top of one another within a single package of a memory device. This stacking technique not only provides for multiple increases in memory sizes, but the technique is also able to accomplish the foregoing without significantly increasing the board space footprint that the memory occupies. A recent development in memory stacking involves utilizing one die in the stack as a primary die to handle all interfacing conducted with external systems and/or devices (i.e., command, address, clock input, data input/output, etc.) and to communicate with all other secondary die within the package via inter-die signaling. In such configurations, communications and/or signaling between the primary die and each of the secondary die are kept internal to the memory package of the memory device. Hosts, such as external hosts, that may seek to interact with the memory device do so by interfacing only with the primary die of the stacked memory. As a result, the host may not see or directly communicate with the secondary memory dies of the stacked memory and may only communicate with the primary die.

Typically, internal buses, paths, and/or inter-die lines between the primary die and the secondary dies are entirely internal to the memory package of the memory device and do not connect to external hosts, devices, and/or systems. In certain instances, inter-die lines utilized within the stacked memory of the memory device may be unidirectional or bidirectional. An example of a unidirectional line includes inter-die command and address lines, for which signals are transmitted from the primary die to be received by each of the secondary dies within the memory stack of the package. An example of a bidirectional line includes transmitting signals including read and write data on the same inter-die line of the stacked memory of the package of the memory device. In many instances, electrostatic discharge protection is also provided for every die on unidirectional and/or bidirectional lines utilized with memory devices. Electrostatic discharge protection may be utilized to prevent and/or reduce damage to portions of the memory device that may result from electrostatic discharges occurring within the stacked memory of the memory device.

During operation of the memory device, the primary die of the memory stack may receive requests and/or signals from hosts, such as external systems, devices, and/or components. The requests may be to retrieve data, store data, modify data, access data, delete data, and/or perform any operation with respect to data. In response to receiving the requests and/or signals from the host(s), the primary die may generate inter-die signals that are transmitted by the primary die through each of the secondary dies of the stacked memory to effectively respond to the requests and/or signals received from the host(s). Notably, in current systems, these inter-die signals are not just sent to a single component of each secondary die, but, instead, are transmitted and/or propagated through every component on each die in the stacked memory. For example, each secondary die in the stacked memory may include componentry, such as transmitters, receivers, and electrostatic discharge components. The inter-die signals transmitted by the primary die will touch or propagate through to each of the transmitters, receivers, and electrostatic discharge components in each of the secondary die via inter-die connections established between the primary die and secondary die and also between secondary die and other secondary die within the stacked memory. Since the inter-die signals propagate and/or are transmitted to the transmitter, receiver, and electrostatic discharge componentry on each die in the stacked memory, these signals increase the signal load within the memory package. Increases in signal load may lead to increases in internal connection delays, clocking of signals, operational delays, power consumption, signal collisions, and response times (e.g., responding to a request from a host). This problem is exacerbated as the stack height of the memory package increases because the inter-die signals will necessarily traverse an increasing number of secondary dies, along with all of their componentry. An exemplary illustration of a stacked memory that provides a visual of how inter-die signals in current systems are transmitted within the stacked memory is shown on the left side of FIG. 6.

To counteract the foregoing issues relating to increases in signal load that affect a stacked memory, one option is to increase the transmitter size, however, doing so results in a bigger layout area on the board, higher active current consumption, larger propagation delays, and greater die-to-die delay variation. Additionally, increasing the transmitter size results in an even higher load on the inter-die signals and eventually increasing transmitter sizes does not provide any further assistance in managing signal loads within the memory package of the memory device. For example, in current memory designs, a stacked memory height of 4H at 3200 MHz speed operation may be supported by increasing the size of the transmitter. However, as the stacked memory height is increased to 8H, 16H, and/or other heights, and/or clock speeds are increased to next generation speeds of 4800 MHz, 6400 MHz, or higher, increasing transmitter size will not work.

To address these and other technical problems associated with existing systems and devices, embodiments of the present disclosure provide for schemes to reduce the load on the inter-die lines, which, in turn, will enable higher memory speed operation, lower power consumption, smaller memory layout sizes, and smaller die-to-die and signal-to-signal delay variation. Memory packages may include various lines between and/or among the primary die and secondary dies that form the stacked memory of the packages of the memory devices. For example, inter-die command and address lines are one-directional/unidirectional. Signals associated with such lines are transmitted from the primary die and are received by every secondary die within the stacked memory. In such a scenario, while the transmitter of the primary die is always active, the transmitters of each of the secondary dies are unused or disabled. Additionally, utilizing electrostatic discharge componentry on each of the die within the stacked memory may be unnecessary and may only serve to increase the signal load within the stacked memory.

Figure 6:
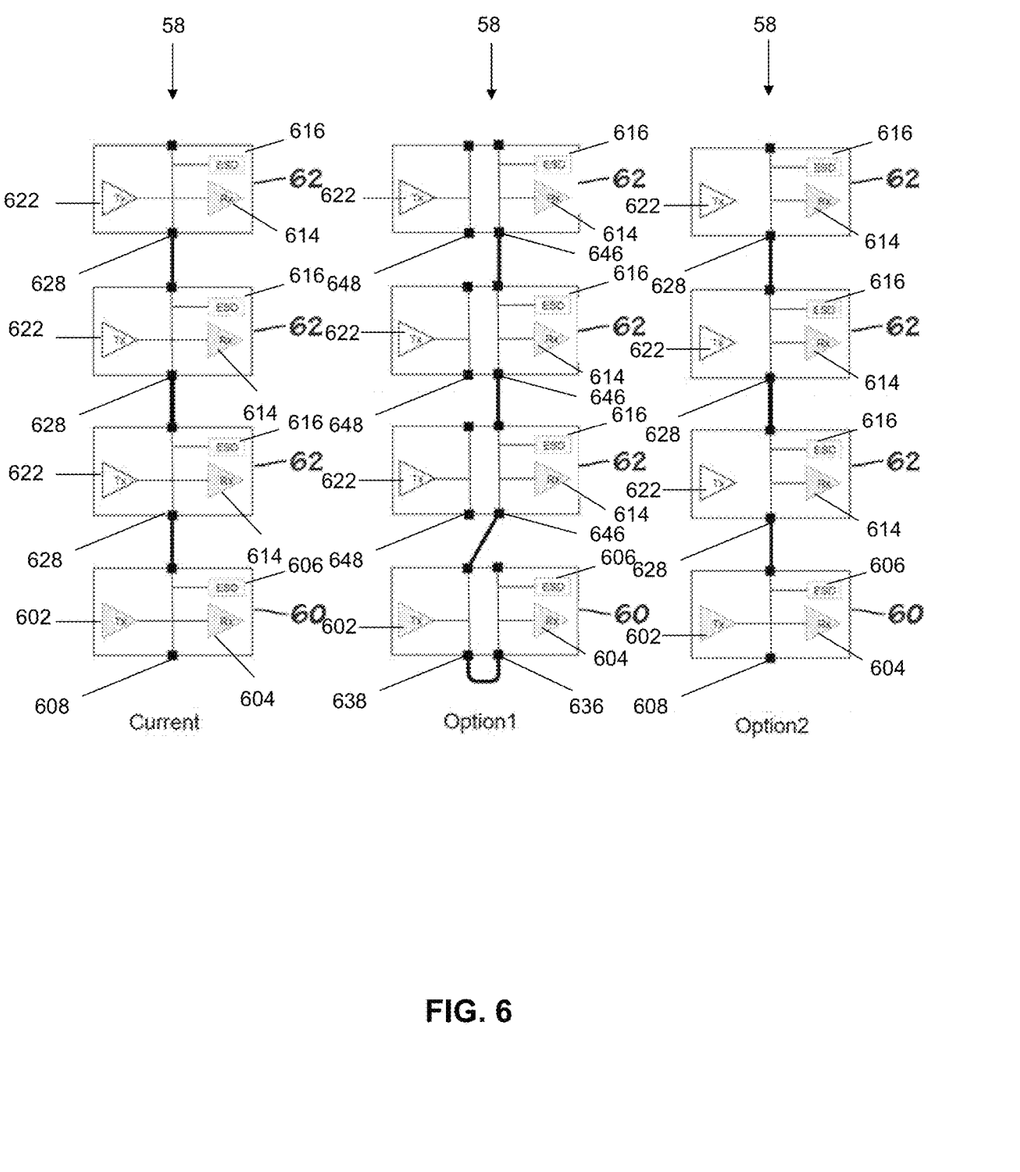
FIG. 6 illustrates a series of schematic diagrams illustrating a current configuration of a memory stack for use with a multi-die package, a first configuration for a memory stack for facilitating reduction of signal load in a multi-die package, and a second configuration for a memory stack for facilitating reduction of signal load in a multi-die package according to embodiments of the present disclosure.

For unidirectional command and address lines, the present disclosure includes disconnecting the transmitter for each of the dies within the stacked memory from the receiver and/or electrostatic discharge componentry by incorporating the use of an additional pad (e.g., Through-Silicon-via (TSV)/wirebond pads/etc.) on each die of the stacked memory, as shown in option 1 of FIG. 6. When inter-die connections are made between the dies within the stacked memory, the present disclosure includes connecting the pad associated with the transmitter for the primary die to the pad connected to the receiver and/or electrostatic discharge component of the secondary die. The pad associated with the transmitter for the primary die will also be connected to the pad associated with the receiver and/or electrostatic discharge component of the primary die. However, the transmitter of each secondary die will remain unconnected from each of their corresponding receiver and/or electrostatic discharge componentry, and, as a result, will not contribute to the loading on the inter-die lines (i.e. the signals will not traverse to the transmitters of the secondary dies, but, instead, will propagate only to the receivers and/or electrostatic discharge componentry of each secondary die). The foregoing aspects of the present disclosure also facilitate transmitter sizing up if needed because, for example, the transmitters on the secondary dies are not contributing to the load on the stacked memory.

For bidirectional lines used in the stacked memory, the bidirectional lines may be bidirectional if read and write data are transmitted on the same inter-die lines. In such a scenario, the present disclosure may include maintaining the connections between the transmitters and receivers on each of the dies within the stacked memory, however, the electrostatic discharge componentry may not be necessary. If the electrostatic discharge componentry is not necessary or is only needed on certain dies within the stacked memory, the electrostatic discharge componentry will be disconnected from the transmitters and receivers for the dies for which electrostatic discharge protection is not necessary. By disconnecting the electrostatic discharge componentry from the transmitters and receivers for the dies, the signal load associated with inter-die signals being transmitted within the stacked memory will be reduced because the signals are not unnecessarily propagating to the unnecessary electrostatic discharge componentry.

In certain embodiments, the present disclosure contemplates other techniques for effectively reducing the signal load within a stacked memory. For example, instead of using the same type of dies for primary and secondary dies, the present disclosure may include utilizing a different type of die for secondary dies than for primary dies. In certain embodiments, the primary die may be of a type that the transmitter, receiver, and/or electrostatic discharge componentry are connected to each other, however, for secondary dies, the transmitters may be disconnected from the receivers and/or electrostatic discharge componentry, as shown in option 2 of FIG. 6. In some embodiments, having a different type of die for the primary die and the secondary dies may include having different masks for the primary die versus the secondary dies. In the secondary die masks, the transmitter may be disconnected from the receiver and/or electrostatic discharge componentry. In some embodiments, the foregoing may be accomplished by using a single wirebond pad (or other type of pad) on each die within the stacked memory. Based on the foregoing techniques provided by embodiments of the present disclosure, the present disclosure reduces signals loads within a stacked memory, reduces signal-to-signal and die-to-die timing variations, enables the use of smaller transmitter sizes, reduces power consumption based on reduced signal load, among a variety of other benefits and enhancements.

Figure 1:
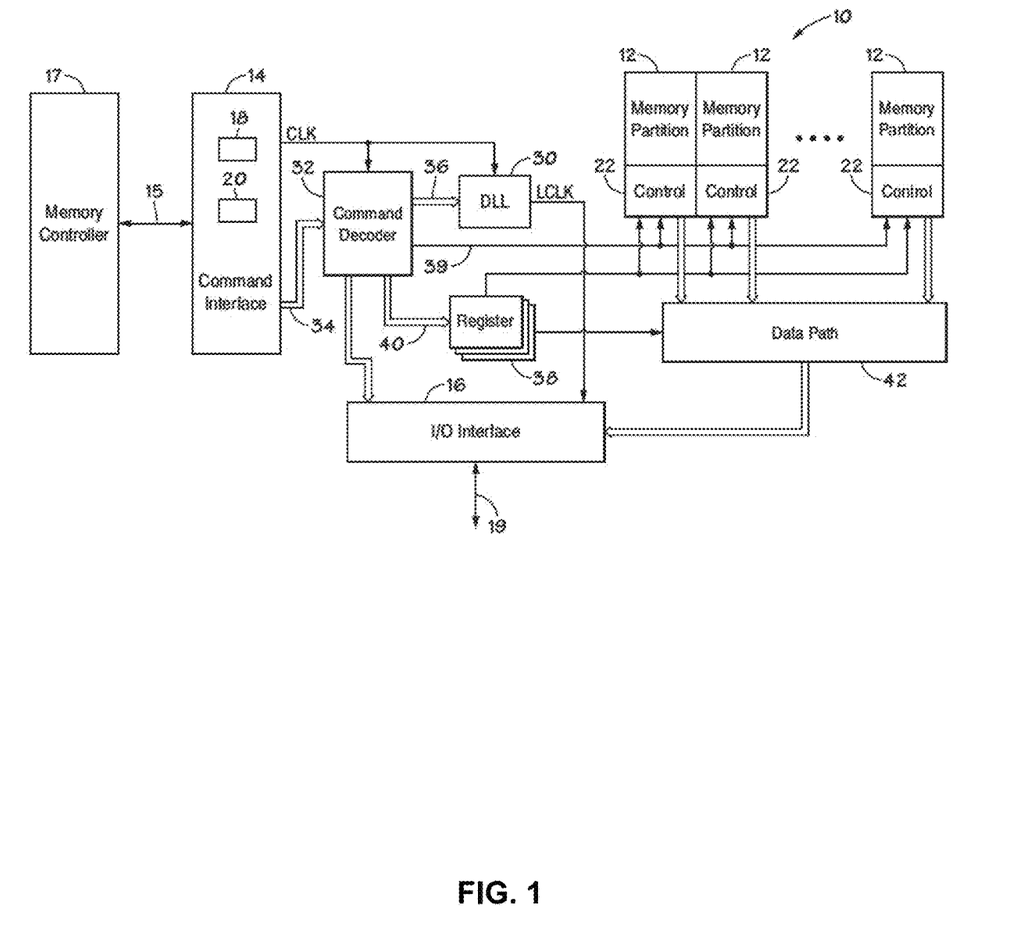
FIG. 1 illustrates a schematic diagram illustrating various features of a memory device according to an embodiment of the present disclosure.

To provide further detail relating to the advancements provided by the present disclosure and detail relating to the structure and functionality of the memory devices themselves, FIG. 1 illustrates a schematic diagram illustrating various features and functionality of a memory device 10 for use with embodiments of the present disclosure. In certain embodiments, the memory device 10 may be a random-access memory (RAM) device, a dynamic RAM (DRAM) device, a static RAM (SRAM) device (including other types of SRAM devices, such as a double data rate SRAM device), flash memory, and/or a phase change memory (PCM) device and/or other type of memory, such as self-selecting memories (SSM). Additionally, in certain embodiments, the memory cells of the memory device 10 may each include a corresponding logic storing device (e.g., a capacitor, a resistor, or the resistance of the chalcogenide material(s)).

In certain embodiments, the memory device 10 may include any number of memory partitions 12. Each of the memory partitions 12 may include one or more arrays (i.e., memory arrays). Various configurations, organizations, and sizes of the memory partitions 12 on the memory device 10 may be utilized depending on the application and design of the overall computing system that is desired. The memory device 10 may also include a command interface 14 and an input/output (I/O) interface 16. In certain embodiments, the command interface 14 may be configured to provide signals received from an external device or host, such as from a processor or controller (e.g., memory controller 17) external to the memory device 10. In some embodiments, a bus 15 (or a signal path or another group of signal paths) may allow for bidirectional transmission of signals between the command interface 14 and the processor or controller (e.g., the memory controller 17). Similarly, a bus 19 (or a signal path or another group of signal paths) may, individually or in combination, allow for bidirectional transmission of signals, including, for example, data signals, between the I/O interface 16 and, for example, the processor or controller (e.g., the memory controller 17). As a result, the processor and/or controller (e.g., the memory controller 17) may provide various signals to the memory device 10 to facilitate the transmission and receipt of data to be written to or read from the memory device 10.

In certain embodiments, the command interface 14 may include a plurality of circuits, such as, but not limited to, a clock input circuit 18 and a command address input circuit 20 to ensure proper handling and processing of the signals received by the memory device 10. The command interface 14 may receive one or more clock signals from an external device or host, such as a processor or controller (e.g., the memory controller 17). Similarly, the command interface may receive commands (e.g., read command, write command, other command, etc.), which may be entered on the positive edges of the clock signal, as well as data, which may be transmitted or received on both positive and negative clock edges of the clock signal. In certain embodiments, the commands may be of a variable clock length (e.g., one or more clocks may be used to receive the commands). In certain embodiments, the clock input circuit 18 may receive the one or more clock signals and generate an internal clock signal CLK from the one or more clock signals. In certain embodiments, the internal clock signal CLK may be supplied to an internal clock generator 30, such as a delay locked loop (DLL) circuit. The internal clock generator 30 may generate a phase controlled internal clock signal LCLK based on the received internal clock signal CLK. The phase controlled internal clock signal LCLK may be supplied to the I/O interface 16 and may be used as a timing signal for determining an output timing of read data.

In certain embodiments, the internal clock signal CLK may also be provided to various other components within the memory device 10 and may be utilized to generate various additional internal clock signals. For example, the internal clock signal CLK may be provided to a command decoder 32. The command decoder 32 may receive command signals from the command bus 34 and may decode the command signals to provide various internal commands. For example, the command decoder 32 may provide command signals to the internal clock generator 30 over the bus 36 to coordinate the generation of the phase-controlled internal clock signal LCLK. In certain embodiments, the phase-controlled internal clock signal LCLK may be used to clock data through the I/O interface 16. Additionally, the command decoder 32 may decode commands, such as read commands, write commands, register set commands, activate commands, and/or other commands, and may provide access to a memory partition 12 corresponding to the command, such as via bus path 39. The command decoder 32 may also transmit various signals to one or more registers 38 via, for example, bus path (e.g., one or more global wiring lines 40). In certain embodiments, the memory device 10 may include various other types of decoders, such as row decoders and column decoders, that may be utilized to facilitate access to the memory partitions 12. In certain embodiments, each memory partition 12 may include a control block 22 which may provide the necessary decoding (e.g., row decoder and column decoder), as well as other features, such as timing control and data control, to facilitate the execution of commands to and from the memory partitions 12.

In certain embodiments, the command decoder 32 or other component in the memory device 10 may provide register commands to the one or more registers 38, which may be utilized in operations of each memory partition 12, each control block 22 (or partition controller therein), and the like. For example, one of the one or more registers 38 may operate to define various modes of programmable operations and/or configurations of the memory device 10. Registers 38 may be included in semiconductor devices to define operations for various types of memory components, such as DRAM, synchronous DRAM, chalcogenide memories (e.g., PCM) or other types of memories. The one or more registers 38 may receive various signals from the command decoder 32 (or other similar components) via global wiring lines 40. The global wiring lines 40 may include a common data path, a common address path, a common write command signal path, and a common read command signal path. The global wiring lines 40 may traverse across the memory device 10, such that each register 38 may couple to the global wiring lines 40. The additional registers may involve additional wiring across the semiconductor device (e.g., die), such that the registers are communicatively coupled to the corresponding memory components.

In certain embodiments, the one or more registers 38 may operate as an example of registers that, when in operation, are accessed or otherwise accessible by the memory controller 17. The registers accessible by the memory controller 17 may be dispersed across the memory device 10 and the registers may represent or contain information such as configuration settings of the memory device 10 and/or specific components therein, status of the memory device 10 and/or specific components therein, memory device 10 parameters and/or specific parameters for components of the memory device 10, as well as predetermined patterns that can be written across the memory device (e.g., in one or more of the memory partitions 12). While the registers 38 are illustrated in FIG. 1, additional and/or alternative registers may be located in the memory device and such registers may be accessible by the memory controller 17 (i.e., when in operation, the registers may be accessed by the memory controller 17). In certain embodiments, the accesses by the memory controller 17 may include, for example, reads of the registers (e.g., read accesses) and/or writes to the registers (e.g., write accesses).

In certain embodiments, the memory device 10 may execute operations, such as read commands and write commands, based on the command and/or address signals received from an external device/host, such as a processor and/or by the memory controller 17. In certain embodiments, command/address signals may be clocked to the command interface 14 using clock signals. The command interface may include a command address input circuit 20 which may be configured to receive and transmit the commands to provide access to the memory partitions 12, through the command decoder 32. Additionally, the command interface 14 may receive memory select signals that enable the memory device 10 to process commands on the incoming command/address signals. In certain embodiments, access to specific memory partitions 12 within the memory device 10 may be encoded in the commands. Furthermore, the command interface 14 may be configured to receive a plurality of other command signals. For instance, a reset command may be used to reset the command interface 14, status registers, state machines and the like, during power-up for instance. Various signals to facilitate testing of the memory device 10 may be provided, as well. For example, the testing signals may be used to place the memory device 10 into a test mode for connectivity testing. The command interface 14 may also be used to provide an alert signal or another alarm signal to the system processor or controller for certain errors that may be detected. However, in certain embodiments, the I/O interface 16 may be utilized to transmit an alert signal, such as a thermal alert.

Data may be sent to and from the memory device 10, utilizing the command and clocking signals discussed above, by transmitting and receiving data signals through the I/O interface 16. Indeed, the data may be sent to or retrieved from the memory partitions 12 over the data path 42, which may include a plurality of bi-directional data buses. Data I/O signals may generally be transmitted and received in one or more bi-directional data busses to and from the I/O interface 16. For certain memory devices, such as a DDR5 SDRAM memory device, the I/O signals may be divided into upper and lower bytes, however, such segmentation may not be required for other types of memory devices. Notably, various other types of components, such as power supply circuits (for receiving external VDD and VSS signals), read/write amplifiers (to amplify signals during read/write operations), temperature sensors (for sensing temperatures of the memory device 10), and/or other components, may also be incorporated into the memory device 10. Accordingly, the specific configuration of the components schematic diagram of FIG. 1 is only provided to highlight certain functional features of the memory device 10 of the present disclosure.

Figure 2:
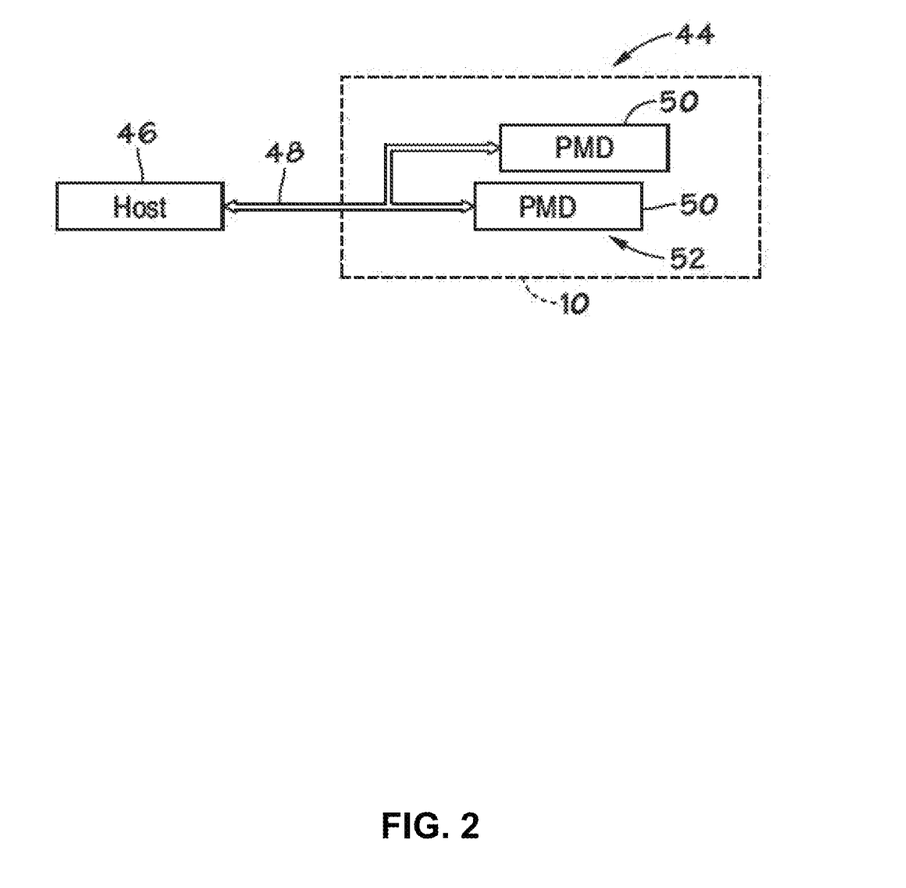
FIG. 2 illustrates a schematic diagram illustrating an exemplary memory stack for use with the memory device of FIG. 1 according to an embodiment of the present disclosure.

Referring now also to FIG. 2, FIG. 2 illustrates a diagram 44 depicting stacking of memory in the memory device 10. As illustrated, a host device 46 (i.e., memory controller 17, a CPU in the host device, or other device or component) may transmit commands and/or data to the memory device 10 via a front-end interface path 48, which may be one or more of the bus 15 and the bus 19 described in the description for FIG. 1. The front-end interface path 48 may operate as a command and/or data input output pathway (e.g., a bus or a signal path or another group of signal paths). Furthermore, as illustrated in FIG. 2, each memory die 50 may be stacked into a memory stack 52 (e.g., a 3D memory stack) so that multiple memory dies 50 may be present in the memory device 10 with a reduced board space footprint on the package of the memory device 10.

Figure 3:
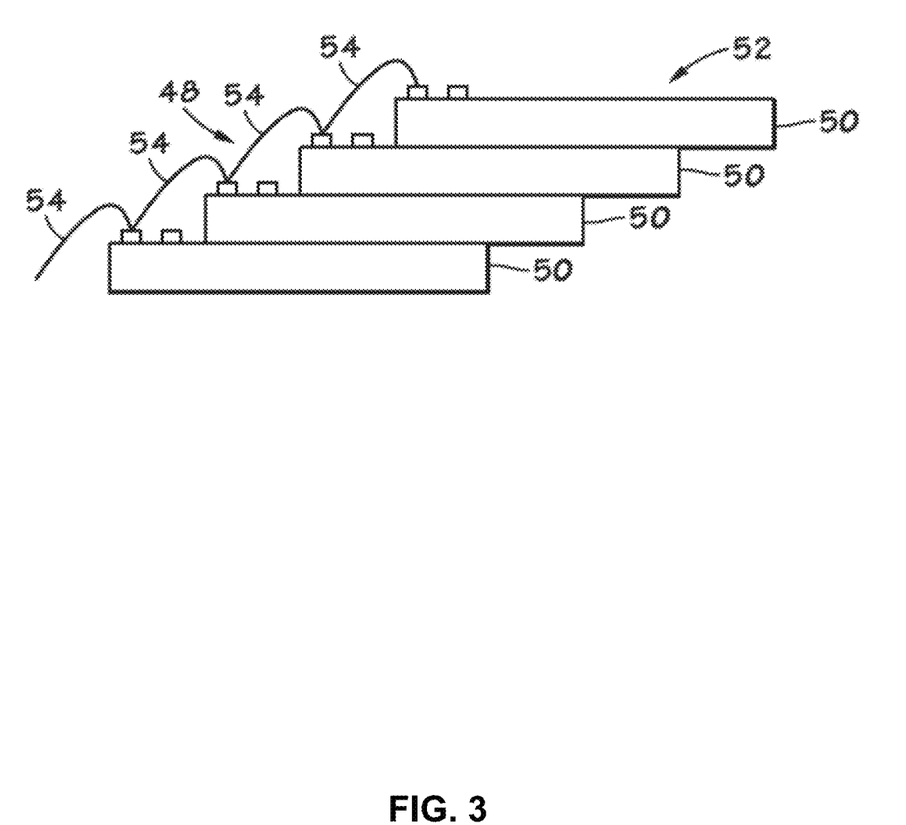
FIG. 3 illustrates a schematic diagram illustrating an exemplary configuration for the memory stack of FIG. 2 according to an embodiment of the present disclosure.

Referring now also to FIG. 3, FIG. 3 illustrates an exemplary memory stack 52 in which the front-end interface path may be coupled to each of the memory dies 50. One or more connections (e.g., bond wires 54, TSVs, or the like) may be utilized to extend the front-end interface path to each of the memory dies 50. As illustrated in FIG. 3, this may form a cascade connection, however, it is noted that one or more direct connections for each bond wire 54 can instead be coupled to a substrate, whereby the bond wires 54 are not directly coupled to other memory dies 50 in the memory stack 52. Similarly, a combination of the two wiring techniques may be employed in connecting the memory dies 50 of the memory stack 52 to the front-end interface path 48. In the configurations illustrated in FIG. 2 and FIG. 3, the input command/control/address (as well as the data pins) of the memory device 10 may be shared across the memory dies 50 of the memory stack 52. However, such a configuration may operate to reduce the net interface speed capability of the memory device 10 as a function of the height of the memory stack 52 (e.g., the number of memory dies 50 in the stack utilizing the shared front-end interface path 48 with each memory die 50 operating as a primary die).

Figure 4:
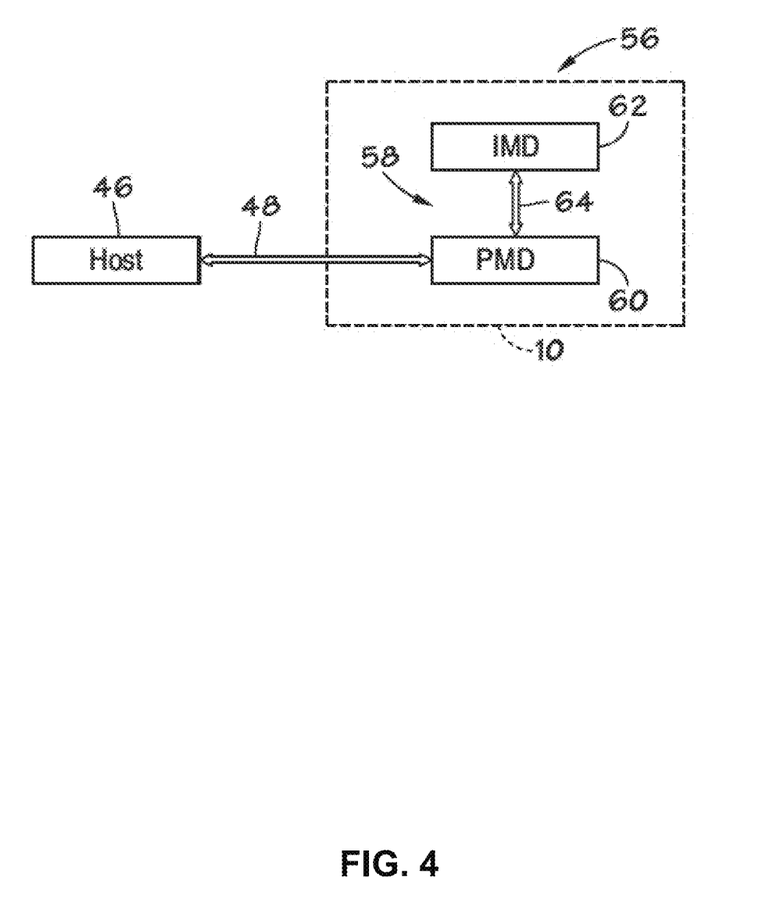
FIG. 4 illustrates a schematic diagram illustrating another exemplary memory stack for use with the memory device of FIG. 1 according to an embodiment of the present disclosure.

Referring now also to FIG. 4, FIG. 4 illustrates a schematic diagram 56 of a second method of conducting memory stacking in the memory device 10. In certain embodiments, the host device 46 (i.e., memory controller 17, a CPU in the host device, and/or other device or component) may transmit commands and/or data to the memory device 10 via the front-end interface path 48, which may be one or more of the bus 15 and the bus 19. Furthermore, as illustrated in FIG. 4, a memory stack 58 may include a primary memory die 60 (similar to memory die 50), as well as one or more secondary memory dies 62 (i.e., internal memory dies (IMD)) stacked on top of the primary memory die 60. Additionally, as illustrated in FIG. 4, the front-end interface path 48 may be connected to the primary memory die 60 and a second path and/or path array (e.g., a back-end interference path 64) may be coupled between the primary memory die 60 and the one or more secondary memory dies 62. This configuration is further illustrated in FIG. 5 of the present disclosure.

Figure 5:
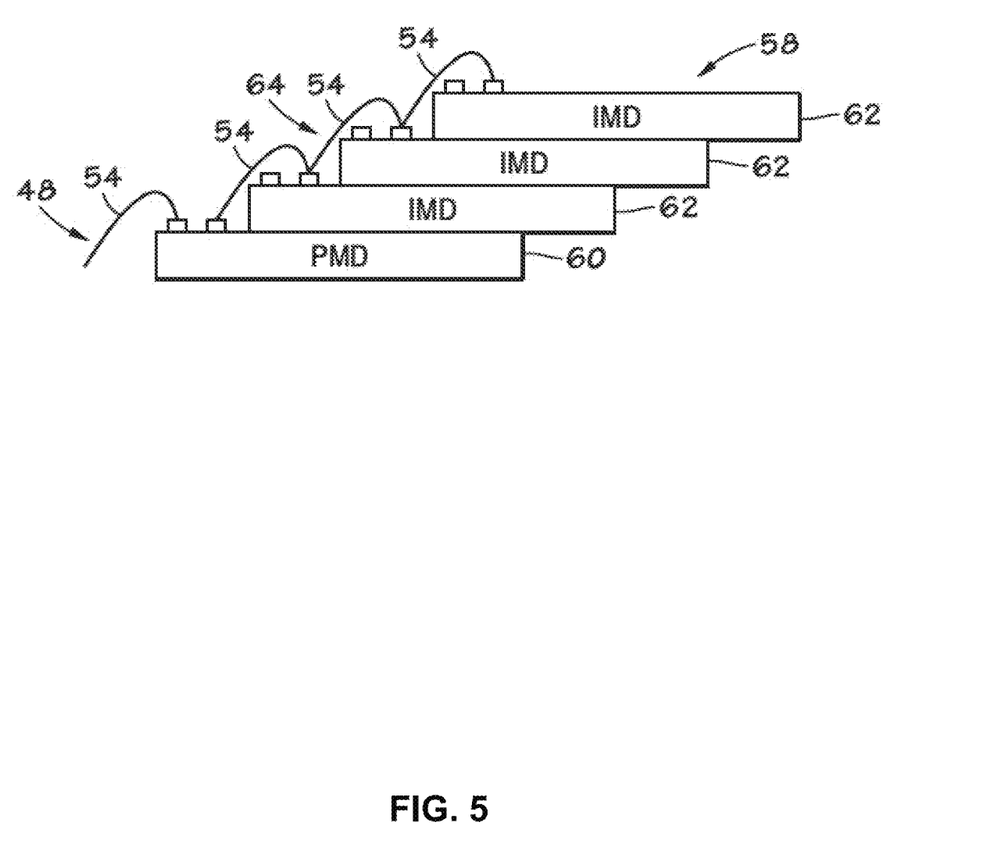
FIG. 5 illustrates a schematic diagram illustrating an exemplary configuration for the memory stack of FIG. 4 according to an embodiment of the present disclosure.

Referring now also to FIG. 5, FIG. 5 illustrates the memory stack 58 including the primary memory die 60 and secondary memory dies 62 stacked on top of the primary memory die 60. While the memory stack 58 is illustrated as including a primary memory die 60 and three secondary memory dies 62 stacked thereon, the primary memory die 60 can be placed in a different location in the memory stack 58. Similarly, a greater or fewer quantity of secondary memory dies 62 may be utilized in the memory stack 58. For example, 1, 2, 3, 7, 11, 15 or any other number of secondary memory dies 62 in addition to the primary memory die 60 of the memory stack 58 may be incorporated into the memory stack 58. In some embodiments, the primary memory die and the secondary memory die 62 may be part of the same or different silicon.

As shown in FIG. 5, the primary memory die 60 may be directly coupled to the front-end interference path 48 via bond wires 54 (or other connection paths). In contrast, the secondary memory dies 62 may be coupled to the front-end interference path 48 via the primary memory die 60. For example, a bond wire 54 may be directly coupled from a first stacked secondary memory die 62 to the primary memory die 60, a second bond wire 54 may be directly coupled from the first stacked secondary memory die 62 to a secondary stacked memory die 62, and so forth for each additional secondary memory die 62 included in the memory stack 58. Based on the foregoing configuration, each secondary memory dies 62 may receive signals (e.g., command, control, and/or address and/or data signals) from the host device 46 indirectly because direct communications between the memory stack 58 and the host device 46 may be performed by the primary memory die 60. Because the host device 46 is only directly coupled to the primary memory die 60 of the memory stack 58, capacitance due to the secondary memory dies 62 of the memory stack 58 is isolated from the host device 46 and the front end interface path 48. This may result in increased signal rates (e.g., data rates) along the front-end interface path 48 relative to the configuration of the memory device illustrated in FIG. 2.

Various types of situations may occur with regard to the memory stack 58. For example, the internal path delay between the primary memory die 60 and the secondary memory die 62 disposed farthest (e.g., by distance) from the primary memory die 60 (i.e., the secondary memory die 62 at the top of the memory stack 58) can affect signal transmissions relative to a clock period of the clock utilized in conjunction with the front-end interface path 48. Similarly, in certain cases, different dies may be used in manufacturing one or more of the primary memory die 60 and the one or more secondary memory dies 62 in the memory, which can lead to differences in, for example, complementary metal-oxide-semiconductor (CMOS) processes of the memory dies 60 and 62 in the memory stack 58. As a result, positional differences and/or other factors of the memory dies 60 and 62 in the memory stack 58 may result in differences in delays between one or more of the memory dies 60 and 62 of the memory stack 58 as well as, for example, signal collisions along the back end interference path 64.

Referring now also to FIG. 6, FIG. 6 illustrates a series of schematic diagrams illustrating an existing configuration of a memory stack (e.g. memory stack 58) for use with a multi-die package, a first embodiment of the present disclosure illustrating a configuration (e.g. option 1 illustrated in FIG. 6) for a memory stack for facilitating reduction of signal load in the multi-die package, and a second embodiment of the present disclosure illustrating a configuration (e.g. option 2 illustrated in FIG. 6) for a memory stack for facilitating reduction of signal load in the multi-die package according to embodiments of the present disclosure. Notably, the first and second embodiments illustrated in FIG. 6 are not limited to the precise configurations as shown, and, instead, may be modified in any appropriate manner as needed or required for a specific use-case scenario.

The existing configuration of a memory stack 58 is illustrated on the left side of FIG. 6. In certain embodiments, the memory stack 58 may include any of the componentry as described for the memory device 10 and may be contained within a single package of the memory device 10. As illustrated, the memory stack 58 may include a primary memory die 60 and one or more secondary memory dies 62 (in FIG. 6 three secondary memory dies 62 are shown for a total stack height of 4H including the primary memory die 60, however, any number may be included in the memory stack 58). In certain embodiments, the primary memory die 60 may include a primary memory die transmitter 602, a primary memory die receiver 604, a primary memory die ESD component 606, among other componentry. In certain embodiments, the primary memory die transmitter 602 may be utilized to transmit inter-die signals and/or other signals via lines of the primary memory die 60. In certain embodiments, the primary memory die receiver 604 may be utilized to receive inter-die signals and/or other signals via lines of the primary memory die 60. In certain embodiments, the primary memory die ESD component 606 may include componentry to reduce or prevent potential damage from electrostatic discharges that may occur within the primary memory die 60.

In certain embodiments, inter-die signals may be generated by the primary memory die 60 in response to receipt of a signal and/or request provided by a host device and/or system. For example, the request from the host device may be to access data stored in the memory stack 58, write data to the memory stack 58, modify data in the memory stack 58, delete data from the memory stack 58, and/or perform any other operations that may utilized the features and/or functionality of the memory stack 58. The inter-die signals may reach the primary memory die receiver 604 and the primary die ESD component 606 via lines connected to a wirebond pad 608 (or TSV or other structure). The inter-die signals may be transmitted from the primary memory die 60 to the first secondary memory die 62 in the memory stack 58, such as by an inter-die connection facilitated by the wirebond pad 608 and the wirebond pad 628 of the first secondary memory die 62.

Once the inter-die signals are received by the first secondary memory die 62, the inter-die signals will be propagated to each of the components of the first secondary memory die 62. The components of the secondary memory die 62 may include a first secondary memory die transmitter 622, a first secondary memory die receiver 614, and a first secondary memory die ESD component 616. The inter-die signals may then be propagated to each subsequent secondary memory die 62 in the memory stack 58. In FIG. 6, the inter-die signals may be propagated to the second secondary memory die 62 and also to the third secondary memory die 62 via inter-die connections facilitated by corresponding wirebond pads 628. The inter-die signals will also be propagated to all of the components of the second secondary memory die 62 and the third secondary memory die 62, which include their own corresponding transmitters, receivers, and ESD componentry. As a result, since the inter-die signals touch the transmitters, receivers, and ESD componentry of each die in the memory stack 58, the signal load on the memory stack 58 may be significant. Indeed, as the memory stack 58 height increases from 4H (as shown in FIG. 6) to greater heights, such as 8H or 16H, the load on the inter-die signals increases even further, which leads to propagation delays relating to signaling, increased power consumption, increased inter-die connection delays, among other detrimental effects.

In the above-described scenario, inter-die command and address lines are one-directional/unidirectional. Signals associated with such lines are transmitted from the primary memory die 60 and are received by each secondary memory die 62 within the stacked memory 58. While the primary memory die transmitter 602 of the primary memory die 60 is always active, the transmitters 622 of each of the secondary memory dies 62 are unused and/or are disabled. Additionally, utilizing ESDs 606, 616 on each of the die within the memory stack 58 may be unnecessary and may only serve to increase the signal load within the memory stack 58.

Referring now also to option 1 in FIG. 6, for unidirectional lines (e.g., unidirectional command and address lines that are sent from the primary memory die 60 to each secondary memory die 62 in one direction), the present disclosure includes disconnecting the transmitters 602, 622 for each of the dies within the memory stack 58 from the receivers 604, 614 and/or ESD componentry 616 by incorporating the use of an additional pad (e.g., TSV/wirebond pads/etc.) on each die of the memory stack 58. For example, instead of just having a single wirebond pad 608 for the primary memory die 60, a wirebond pad 636 connecting the primary memory die receiver 604 and the primary memory die ESD component 606 may be utilized, and a separate wirebond pad 638 for the primary memory die transmitter 602 may be utilized. Similarly, instead of just having a single wirebond pad 628 for the secondary memory dies 62 connecting all of the components within each of the secondary memory dies 62 together, a first wirebond pad 646 connecting the secondary memory die receiver 614 and the secondary memory die ESD component 616 may be utilized, and a second wirebond pad 648 connecting to the secondary memory die transmitter 622 may be utilized.

When establishing inter-die connections between the dies (e.g., between the primary memory die 60 and the first secondary memory die 62 or between other secondary memory dies 62) within the memory stack 58, an embodiment of the present disclosure includes connecting the wirebond pad 638 associated with the transmitter 602 for the primary memory die 60 to the wirebond pad 646 connected to the receiver 614 and/or ESD component 616 of the secondary memory die 62. The wirebond pad 638 associated with the transmitter 602 for the primary memory die 60 will also be connected to the wirebond pad 636 associated with the receiver 604 and/or ESD component 606 of the primary memory die 60. However, the transmitters 622 of each secondary memory die 62 will remain disconnected from each of their receivers 614 and/or ESD componentry 616, and, as a result, will not contribute to the loading on the inter-die lines (i.e., the signals will not traverse/propagate to the transmitters 622 of the secondary memory dies 62, but, instead, will only propagate to the receivers 614 and/or ESD componentry 616 of each secondary memory die 62). In certain embodiments, if the ESD componentry 616 is not needed for certain operations and/or inter-die signals, the ESD componentry 616 may also be disconnected, which will provide even further signal load reduction in the memory stack 58. This embodiment of the present disclosure also facilitates the sizing up of transmitters because the transmitters 622 on the secondary memory dies 62 are not contributing to the load on the memory stack 58.

Regarding bidirectional data lines (e.g., if read and write data are sent on the same inter-die line in the memory stack 58), the present disclosure may include maintaining the connections between the transmitters and receivers on each of the dies within the memory stack 58, however, the ESD componentry 606, 616 for the primary memory dies 60 and secondary memory dies 62 may not be necessary. If the ESD componentry 606, 616 is not necessary or is only needed on certain dies within the memory stack 58, the ESD componentry 606, 616 will be disconnected from the transmitters and receivers for the dies for which ESD protection is not necessary. In certain embodiments, for the bidirectional data lines, the primary memory dies 60 and/or the secondary memory dies 62 may utilize the additional wirebond pads 638, 648, however, in certain embodiments, single wirebond pads 608, 628 may be utilized, but the EDS componentry 606, 616 may be disconnected from the transmitters and/or receivers. By disconnecting the ESD componentry 606, 616 from the transmitters and receivers for the dies, the signal load associated with inter-die signals being transmitted within the memory stack 58 will be reduced because the signals are not propagating to the unnecessary ESD componentry 606, 616.

In certain embodiments, the present disclosure provides additional techniques for effectively reducing the signal load within a memory stack 58, as is shown in option 2 of FIG. 6. For example, instead of using the same type of dies for primary memory and secondary memory dies 60, 62, the present disclosure may include utilizing a different type of die for secondary memory dies 62 than for primary memory dies 60. In certain embodiments, the primary memory die 60 may be of a type that the transmitter 602, receiver 604, and/or ESD componentry 606 are connected to one another. In contrast, however, for secondary memory dies 62, the transmitters 622 may be disconnected from the receivers 614 and/or ESD componentry 616. In some embodiments, having a different type of die for the primary memory die 60 and the secondary memory dies 62 may include utilizing different masks for the primary memory die 60 than the secondary memory dies 62. In the secondary memory die masks, the transmitter 622 may be disconnected from the receiver 614 and/or ESD componentry 616. In certain embodiments, the foregoing may be accomplished by using a single wirebond pad (or other pad) on each die within the memory stack 58, however, in certain embodiments, additional wirebond pads may be utilized as well. By disconnecting the transmitters 622 from the receivers 614 and/or ESD componentry 616 based on having different dies for primary memory dies 60 versus secondary memory dies 62, the inter-die signals will not be propagated to the transmitters 622 of the secondary memory dies 62, thereby facilitating signal load reduction within the memory stack 58. In certain embodiments, features of the options 1 and 2 and/or other embodiments described herein may be combined to provide further signal load reduction and/or memory device 10 enhancement.

Figure 7:
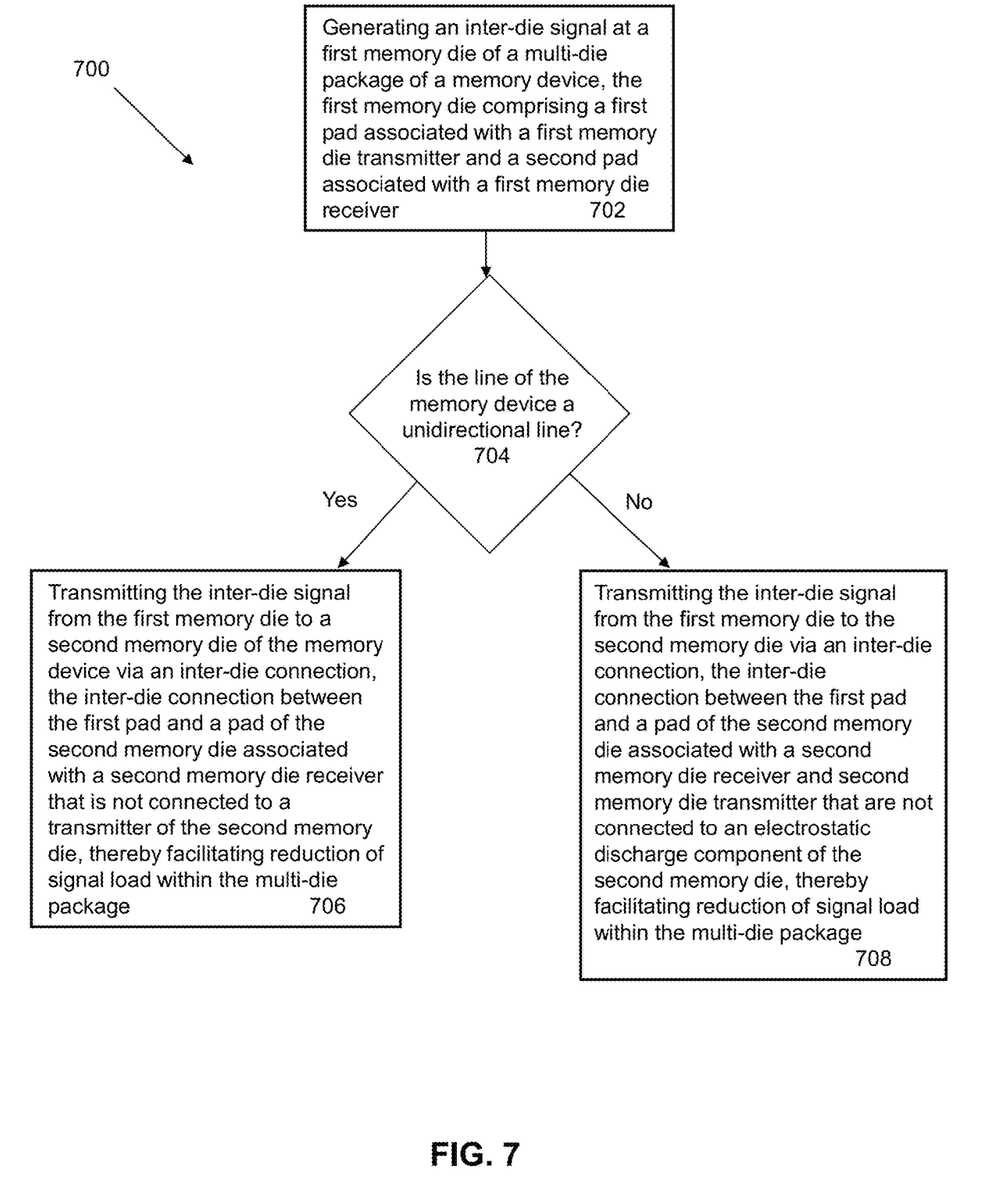
FIG. 7 illustrates a flow chart of a method for facilitating inter-die signal load reduction in a multi-die package of a memory device according to an embodiment of the present disclosure.

An exemplary method 700, shown in FIG. 7, for facilitating load reduction within a memory device 10 including a multi-die package is provided herewith. Notably, the method 700 may include any of the features and/or functionality otherwise described in the present disclosure and is not intended to be limited to the specific steps illustrated in FIG. 7. At step 702 of the method 700, the method 700 may include generating an inter-die signal at a first memory die (e.g., primary memory die 60) of a multi-die package of a memory device 10. The first memory die may include a first wirebond (or other) pad facilitating a connection to a first memory die transmitter and a second wirebond (or other) pad facilitating a connection to a first memory die receiver and/or ESD component (if needed). In certain embodiments, the inter-die signal may be generated by the first memory die based on the first memory die receiving a request and/or signal from a host system or device requiring use of the memory device 10.

At step 704, the method 700 may include determining whether lines utilized to propagate signals within the memory stack 58 of the memory device 10 are unidirectional or bidirectional lines. If the determination indicates that the lines are unidirectional, the method 700 may include transmitting, at step 706, the inter-die signal from the first memory die to a second memory doe of the memory stack 58 via an inter-die connection. In certain embodiments, the inter-die connection may be facilitated by utilizing the first wirebond pad connecting the first memory die transmitter to a wirebond pad of a second memory die (e.g., secondary memory die 62). The wirebond pad of the second memory die may that is connected to the first wirebond pad of the first memory die may not be connected to the transmitter of second memory die. As result, the lack of connection facilitates the reduction of signal loads on the memory stack 58 of the memory device 10 because the transmitter of the second memory die does not receive the inter-die signals transmitted by the primary memory die.

If, however, at step 704, the determination indicates that the lines are bidirectional (i.e., read and write is occurring on the same inter-die line), the method 700 may proceed to step 708. At step 708, the method 700 may include transmitting the inter-die signal from the first memory die to the second memory die via an inter-die connection. The inter-die connection may be between the first pad of the first memory die 60 to a pad of the second memory die 62 that is connected to the second memory die receiver and also to the second memory die transmitter, but not to an ESD component of the second memory die 62. In this scenario, the signal load may be reduced within the memory stack 58 because the inter-die signals are not propagating to the ESD components on the second memory dies 62 within the memory stack 58. Notably, the method 700 may incorporate any of the other functionality and features described herein.

The disclosure includes various devices which perform the methods and implement the systems described above, including data processing systems which perform the methods, and computer-readable media containing instructions, which when executed on data processing systems, cause the systems to perform the methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the computer-readable medium used to affect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system, comprising:
a host; and
a memory device comprising:
  a first memory die configured to handle interfacing for the memory device with the host, wherein the first memory die comprises a first wirebond pad associated with a first memory die transmitter and a second wirebond pad associated with a first memory die receiver; and
  a second memory die coupled to and configured to communicate with the first memory die via a first inter-die connection, wherein the second memory die comprises a third wirebond pad associated with a second memory die transmitter and a fourth wirebond pad associated with a second memory die receiver, wherein:
    for a unidirectional line of the memory device, the first inter-die connection between the first memory die and the second memory die is established by connecting the first wirebond pad associated with the first memory die transmitter to the fourth wirebond pad associated with the second memory die receiver, wherein the second memory die transmitter is not connected to the second memory die receiver and the first memory die transmitter, thereby reducing a signal load on the memory device that is generated when at least one inter-die signal is transmitted via the first inter-die connection.

2. The system of claim 1, wherein the fourth wirebond pad of the second memory die is connected to an electrostatic discharge component of the second memory die that is configured to reduce or prevent electrostatic discharge damage to the memory device.

3. The system of claim 2, wherein, for the unidirectional line of the memory device and if electrostatic discharge protection is required for the memory device, the first inter-die connection between the first memory die and the second memory die is established by connecting the first wirebond pad associated with the first memory die transmitter to the fourth wirebond pad associated with the second memory die receiver and the electrostatic discharge component.

4. The system of claim 1, further comprising a third memory die coupled to the second memory die to form a memory stack with the first memory die within the memory device, wherein the third memory die comprises a fifth wirebond pad associated with a third memory die transmitter and a sixth wirebond pad associated with a third memory die receiver.

5. The system of claim 4, wherein the third memory die is coupled to the second memory die via a second inter-die connection that is established by connecting the fourth wirebond pad of the second memory die to the sixth wirebond pad associated with the third memory die receiver, and wherein the third memory die transmitter is not connected to the third memory die receiver and the second memory die transmitter, thereby reducing the signal load on the memory device.

6. The system of claim 1, wherein, for a bidirectional line of the memory device, the first inter-die connection is established by connecting the first wirebond pad associated with the first memory die transmitter to the third wirebond pad associated with the second memory die transmitter and to the fourth wirebond pad associated with the second memory die receiver.

7. The system of claim 6, wherein the second memory die transmitter and the second memory die receiver are disconnected from an electrostatic discharge component of the second memory die to facilitate reduction of the signal load.

8. The system of claim 1, wherein, for a bidirectional line of the memory device, the second memory die comprises only a third wirebond pad associated with the second memory die transmitter and the second memory die receiver, and wherein the first inter-die connection is established by connecting the first wirebond pad associated with the first memory die transmitter to the third wirebond pad.

9. The system of claim 1, wherein the unidirectional line of the memory device comprises a command and address line, and wherein a bidirectional line of the memory device comprises a read and write data line.

10. The system of claim 1, wherein the first wirebond pad associated with the first memory die transmitter is connected to the second wirebond pad associated with the first memory die receiver.

11. The system of claim 1, wherein the second memory die is configured to only communicate with the first memory die, other memory die in a memory stack formed with the first memory die, or a combination thereof.

12. The system of claim 1, wherein the at least one inter-die signal is received by each die in a memory stack comprising the first memory die, the second memory die, other memory die, or a combination thereof.

13. The system of claim 1, wherein reducing the signal load on the memory device facilitates lower power consumption for the memory device, higher speed operation for the memory device, reduced layout size for the memory device, reduced die-to-die and signal-to-signal delay variation, or a combination thereof.

14. The system of claim 1, wherein the second memory die transmitter is disabled, unused, or a combination thereof, when the memory device utilizes the unidirectional line, thereby facilitating reduction of the signal load on the memory device.

15. The system of claim 1, wherein the first memory die of the memory device comprises a different die type than the second memory die of the memory device.

16. The system of claim 15, wherein the different die type comprises having a first mask for the first memory die and a second mask for the second memory die, wherein the first mask and the second mask are different.

17. A device, comprising:
 a first memory die comprising a first wirebond pad associated with a first memory die transmitter and a second wirebond pad associated with a first memory die receiver;
 a second memory die coupled to and configured to communicate with the first memory die via a first inter-die connection, wherein the second memory die comprises a third wirebond pad associated with a second memory die transmitter and a fourth wirebond pad associated with a second memory die receiver, wherein:
  for a unidirectional line of the device, the first inter-die connection between the first memory die and the second memory die is established by connecting the first wirebond pad associated with the first memory die transmitter to the fourth wirebond pad associated with the second memory die receiver, wherein the second memory die transmitter is not connected to the second memory die receiver and the first memory die transmitter, thereby facilitating reduction of a signal load on the device that is generated when at least one inter-die signal is transmitted via the first inter-die connection.

18. A device, comprising:
 a first memory die comprising a first wirebond pad associated with a first memory die transmitter;
 a second memory die coupled to and configured to communicate with the first memory die via a first inter-die connection, wherein the second memory die comprises a second wirebond pad associated with a second memory die receiver, wherein:
  for a bidirectional line of the device, the first inter-die connection between the first memory die and the second memory die is established by connecting the first wirebond pad associated with the first memory die transmitter to the second wirebond pad associated with the second memory die receiver, wherein the second memory die receiver and a second memory die transmitter of the second memory die are not connected to an electrostatic discharge component of the second memory die, thereby facilitating reduction of a signal load on the device when at least one inter-die signal is transmitted via the first inter-die connection.

19. The device of claim 18, wherein the first memory die is configured to generate the at least one inter-die signal in response to receiving a request from a host system.

20. The device of claim 18, wherein the device is configured to determine whether a plurality of lines of the device comprise the bidirectional line, a unidirectional line, or a combination thereof.

21. The device of claim 18, further comprising a third memory die coupled to the second memory die via a second inter-die connection that is established by connecting the second wirebond pad to a third wirebond pad associated with the third memory die.

\* \* \* \* \*